United States Patent
Bolotin et al.

(10) Patent No.: US 6,206,705 B1
(45) Date of Patent: Mar. 27, 2001

(54) THREE-DIMENSIONAL MODULAR ELECTRONIC INTERCONNECTION SYSTEM

(75) Inventors: Gary S. Bolotin, Encino; John Cardone, Simi Valley, both of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/165,175

(22) Filed: Oct. 1, 1998

Related U.S. Application Data
(60) Provisional application No. 60/060,891, filed on Oct. 3, 1997.

(51) Int. Cl.[7] .............. H01R 12/00; H05K 1/00
(52) U.S. Cl. ................. 439/69; 439/66; 439/74; 361/726; 257/704
(58) Field of Search .................. 439/69, 74, 66, 439/91, 71; 361/803, 726, 735, 820, 790, 774; 257/685, 704; H01R 9/09

(56) References Cited

U.S. PATENT DOCUMENTS

| | | | |
|---|---|---|---|
| 5,221,209 | * 6/1993 | D'Amico | 439/71 |
| 5,226,823 | * 7/1993 | Johnson | 439/66 |
| 5,462,442 | * 10/1995 | Umemura et al. | 439/69 |
| 5,632,626 | * 5/1997 | Collins et al. | 439/66 |
| 5,677,830 | * 10/1997 | Nogas et al. | 361/790 |
| 5,910,885 | * 6/1999 | Gulachenski et al. | 361/774 |

OTHER PUBLICATIONS

Dr. Paul L. Borril, Advances in Bus Architecture and Theory, IEEE COMPCON Spring 1995 Conference, Tutorial #4, FSCEM: Mechanical and FSCEM: Stacking Modules, May 1992.*

* cited by examiner

*Primary Examiner*—Lincoln Donovan
*Assistant Examiner*—Brian S. Webb
(74) *Attorney, Agent, or Firm*—Fish & Richardson P.C.

(57) ABSTRACT

A three-dimensional connection system uses a plurality of printed wiring boards with connectors completely around the printed wiring boards, and connected by an elastomeric interface connector. The device includes internal space to allow room for circuitry. The device is formed by stacking an electronics module, an elastomeric interface board on the electronics module such that the interface board's exterior makes electrical connection with the connectors around the perimeter of the interface board, but the internal portion is open to allow room for the electrical devices on the printed wiring board. A plurality of these devices are stacked between a top stiffener and a bottom device, and held into place by alignment elements.

5 Claims, 5 Drawing Sheets

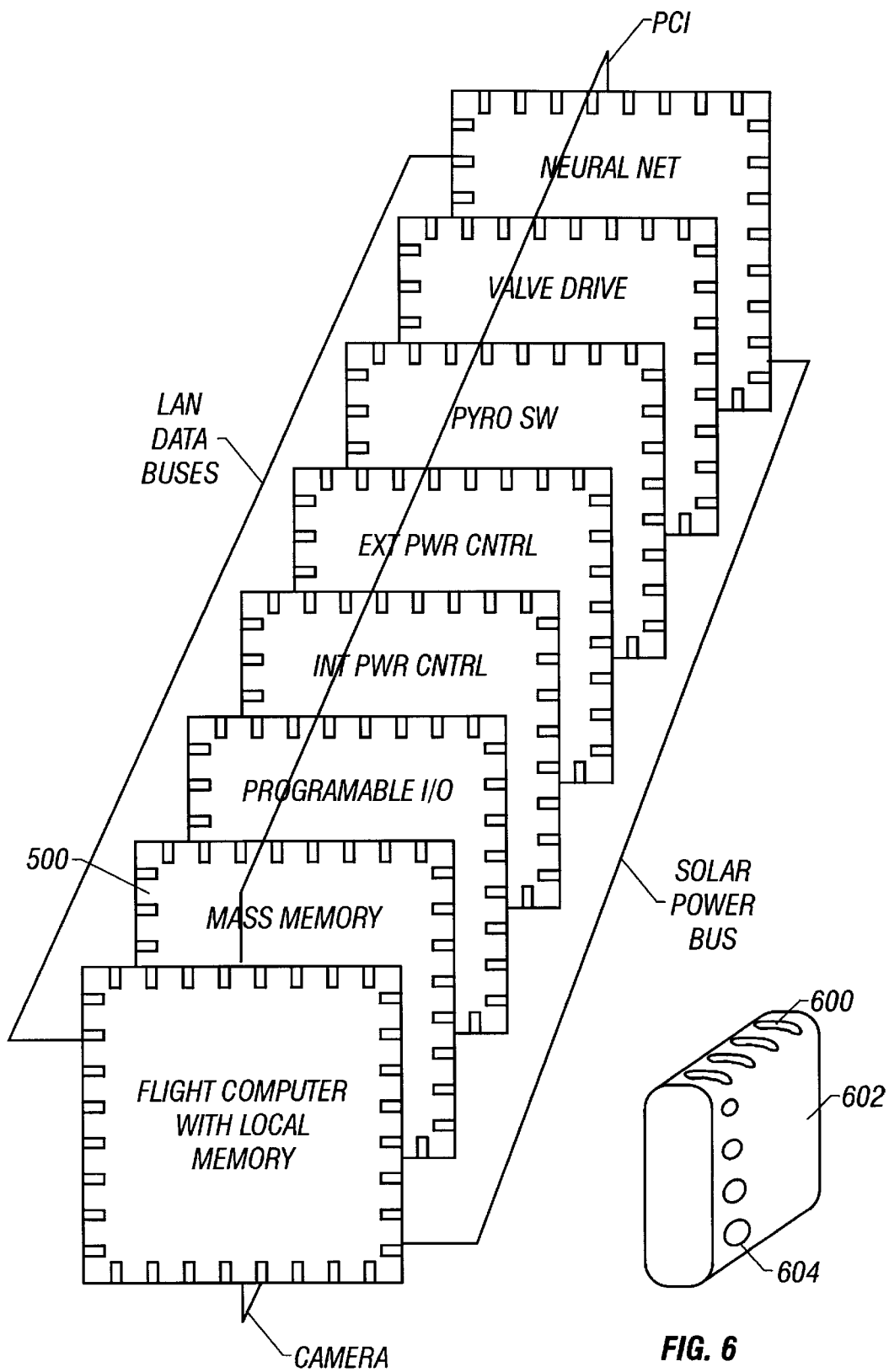

THREE-DIMENSIONAL MODULAR ELECTRONIC INTERCONNECTION SYSTEM

CROSS REFERENCE TO RELATED APPLICATIONS

This application claims the benefit of the U.S. Provisional Application Ser. No. 60/060,891, filed on Oct. 3, 1997, which is incorporated herein by reference.

STATEMENT AS TO FEDERALLY SPONSORED RESEARCH

The invention described herein was made in the performance of work under a NASA contract, and is subject to the provisions of Public Law 96-517 (35 U.S.C. 202) in which the Contractor has elected to retain title.

BACKGROUND

Electronic components are often subjected to harsh environments. For instance, space-employed electronics require components that are rugged, lightweight, and built to withstand high G-forces. Such devices often need to withstand the unpredictable forces involved in liftoff and landing.

Different electronics packaging types are known. One system which has been recently used is the so-called multi-chip module system. The multi-chip module systems are a package with a number of electronic circuitry thereon, in a specified package protocol. All four perimeter edges of the multi-chip module define edge connectors. The multi-chip modules come in many flavors, including a CPU module, Gateway module, DRAM, SRAM, Flash, I/O, and Power modules.

Other such existing electronics packaging systems are also known that do and do not have electrical connections around their entire perimeter.

SUMMARY

The present disclosure describes a packaging system for an electronics system. According to this system, a three-dimensional connection is made by using hollow-center interconnect rings making connections between stacked electronic devices. The interconnect rings are preferably formed from elastomeric connectors with a plurality of conductors on a KAPTON™ device, and retained in place by a connector retainer/spacer. The connector holds the the electronic devices spaced from one another, in electrical communication and with an effective amount of room for electrical components.

The perimeter connectors can define different buses, throughout the device or locally.

BRIEF DESCRIPTION OF THE DRAWINGS

These and other aspects will now be described in detail with reference to the accompanying drawings, wherein:

FIG. 5 shows the bus connections between a plurality of devices;

FIG. 6 shows an inset of an elastomeric connector of the type that is preferably used;

DETAILED DESCRIPTION

Figure 1:
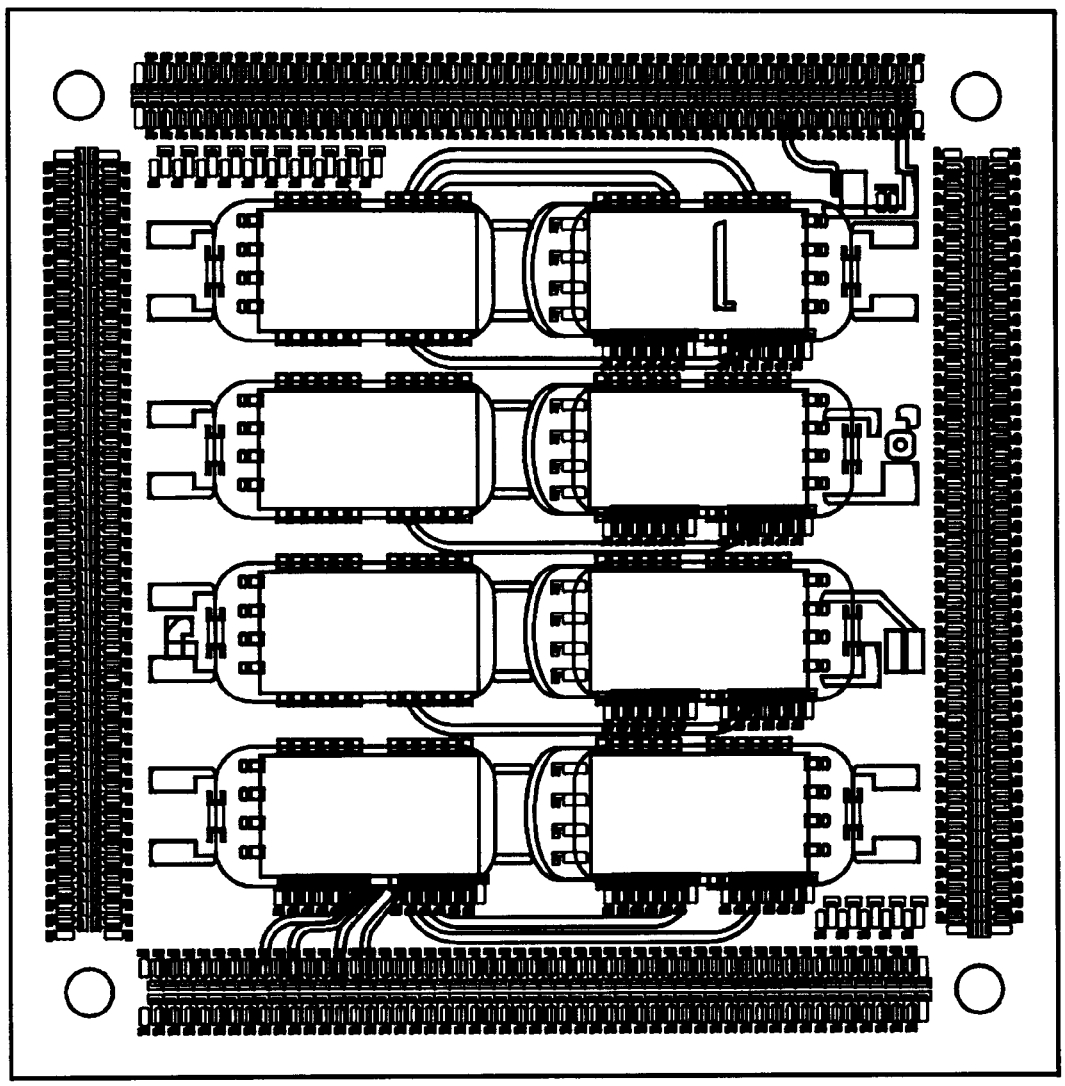
FIG. 1 shows an exemplary circuit board of the type used in the present system.

The preferred system uses a printed circuit card with electrical connections along a number of different portions. A most-preferred card is a multi-chip module, which has a connection around its entire perimeter. An example is shown in FIG. 1. Alternatively, a single integrated circuit with connections around its entire perimeter such as an application-specific integrated circuit (ASIC) can be used, or any printed circuit card.

Figure 2:
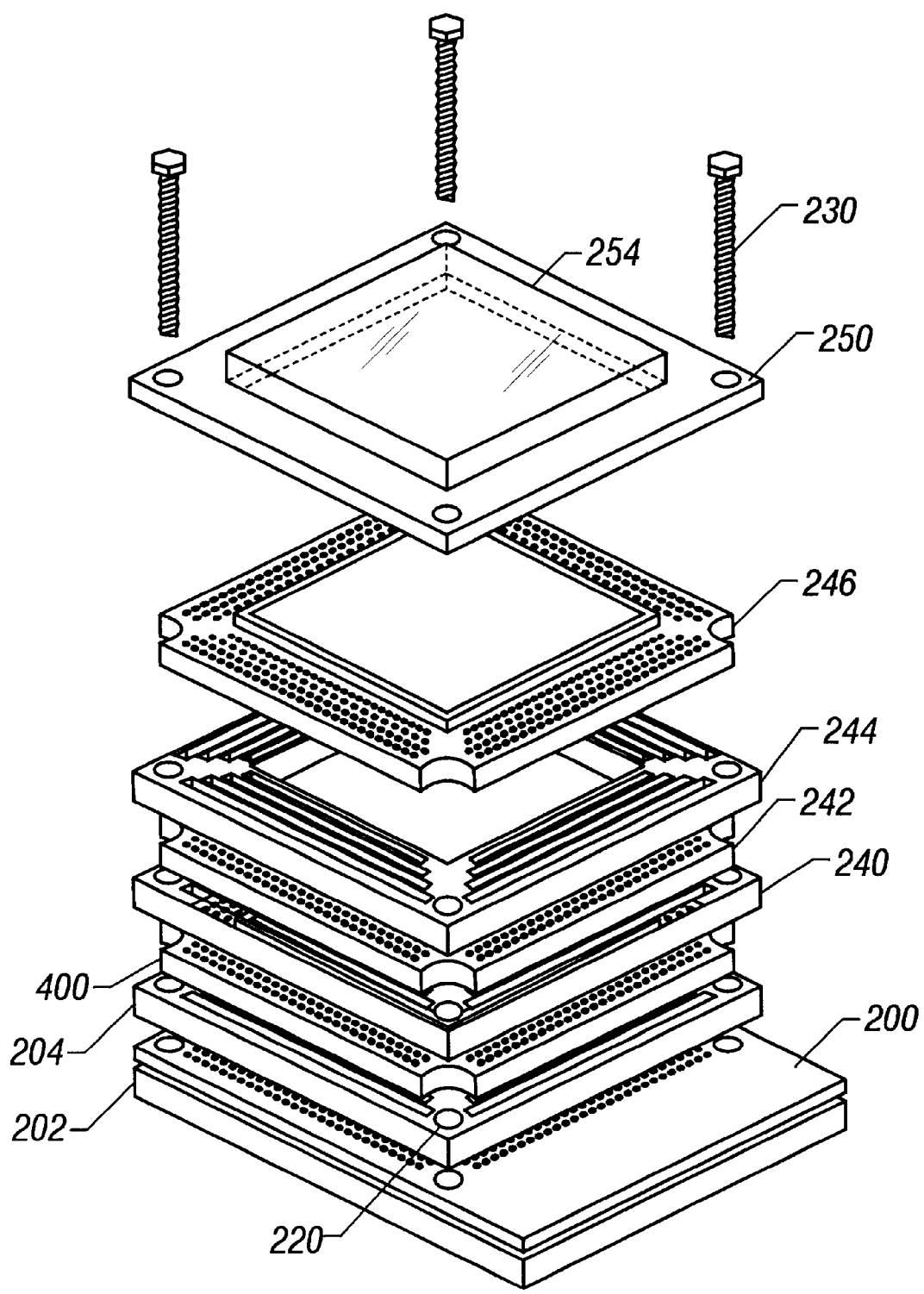
FIG. 2 shows a first embodiment of the invention showing the various layers connected together.

An embodiment showing the basic structure in an exploded view is depicted in FIG. 2. A printed wiring board chassis 200 forms the bottom support for the three-dimensional device. The chassis can and preferably does include a connection bus and internal printed wiring as shown at 202. The main chassis 200 can also include circuitry such as shown in FIG. 1, located thereon.

Figure 3:
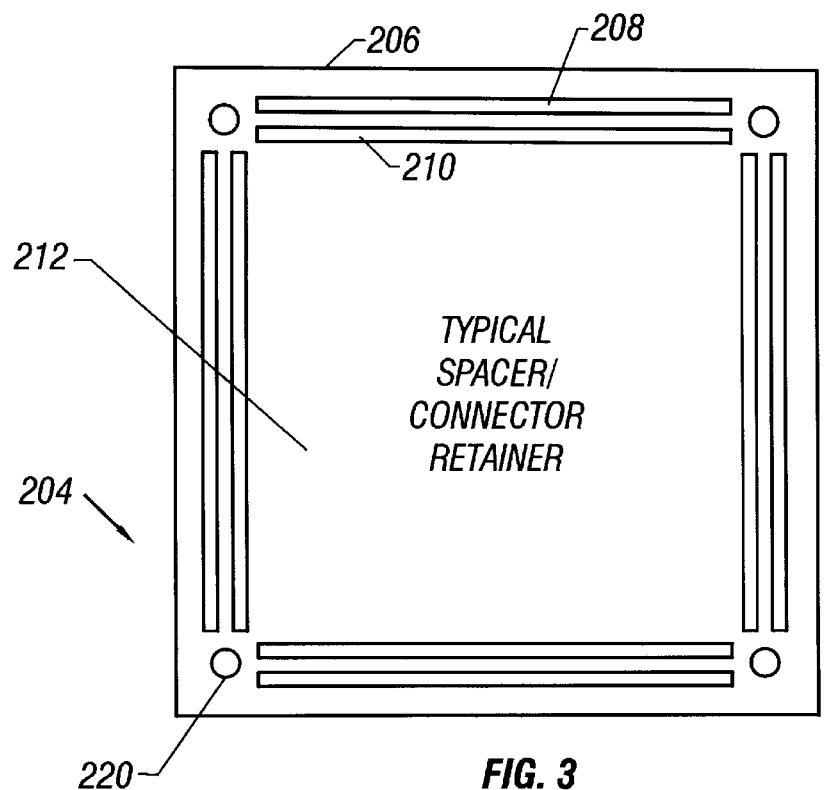
FIG. 3 shows a spacer retainer.

The chassis 202 is covered by, and connected to, a spacer connector/retainer assembly 204. The preferred device is shown in FIG. 3. The device has an inner open area 212 allowing the electronic circuits to extend upward into the space. Perimeter connectors 206 are each formed of an elastomeric connector. There are preferably two rows 208, 210 of elastomeric connectors, extending around the perimeter of the device. The rows of connectors each mate with a different part of the elastomeric device. The center 212 of the device is substantially open. This allows any integrated circuits that are located on the chassis 202 to extend upwards, allowing room for the circuits to be held and cooled.

As well known in the art, an elastomeric connector includes a plurality of conductors at very close pitch spacing, in a flexible substrate. These devices are extremely tolerant of misalignment, since the pitch between adjacent connectors is typically much smaller than, e.g. 10 times smaller than, the pitch of the connectors on the electronic element.

Each corner of the spacer 204 also includes a retaining hole 220. There are four retaining holes on each of the devices. FIG. 2 shows how these devices will eventually be aligned using screws 230 to hold them together relative to one another.

Figure 4:
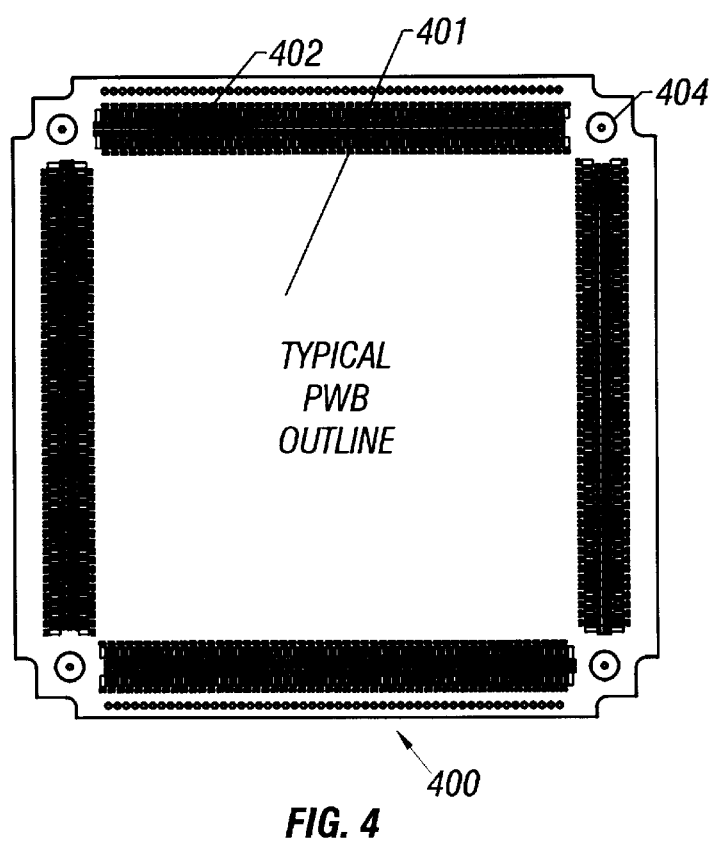
FIG. 4 shows a printed wiring board outline.

The spacer connector/retainer 204 is covered by another printed wiring board 400. The printed wiring board can be any device, of any size, but preferably has the layout shown in FIG. 4. The printed wiring board includes a circuit area 401, surrounded by perimeter connectors 402 extending around the entire perimeter of the printed wiring board. Like the spacer in FIG. 3, the printed wiring board also includes corresponding holes shown as 404.

This is covered by yet another connector 240, another printed wiring board 242, yet another connector 244, another printed wiring board 246, and a cover 250. Any desired number of alternating wiring board and connectors can be used.

The top portion is a stiffener element which provides some dimensional stability to the element. According to a preferred embodiment, the stiffener element can also include a battery pack located therein which includes battery material 254.

FIG. 6 shows an exemplary elastomeric connector. A number of conductors 600 are located in a KAPTON™ base 602 with a silicon core 604.

As described above, the electronics modules could be any of a number of different modules. They are preferably 3½×3½" circuit "slice" boards of standard type printed wiring boards with 160-circuit connectors, the connectors being located on each edge. Alternately, they could be any other kind of printed wiring or electronic device. A number of these devices can be connected one to another, forming buses along the edge plane and connectors.

In a preferred embodiment, one of the four connector buses is defined as a PCI bus, another is partitioned to form a camera interface bus, another is for MicroLan communications, and yet another for solar array input power. Each of the buses is defined along the "edge plane" formed by the elastomeric interconnection rings that extend between the edge connector. An exemplary connection is shown in FIG. 5 showing the PCI bus, solar power bus, LAN data bus, and camera interface bus. Naturally, any of these devices can also include a direct connection, shown as 500 which connects directly to the mass memory for DMA or the like.

Figure 7:
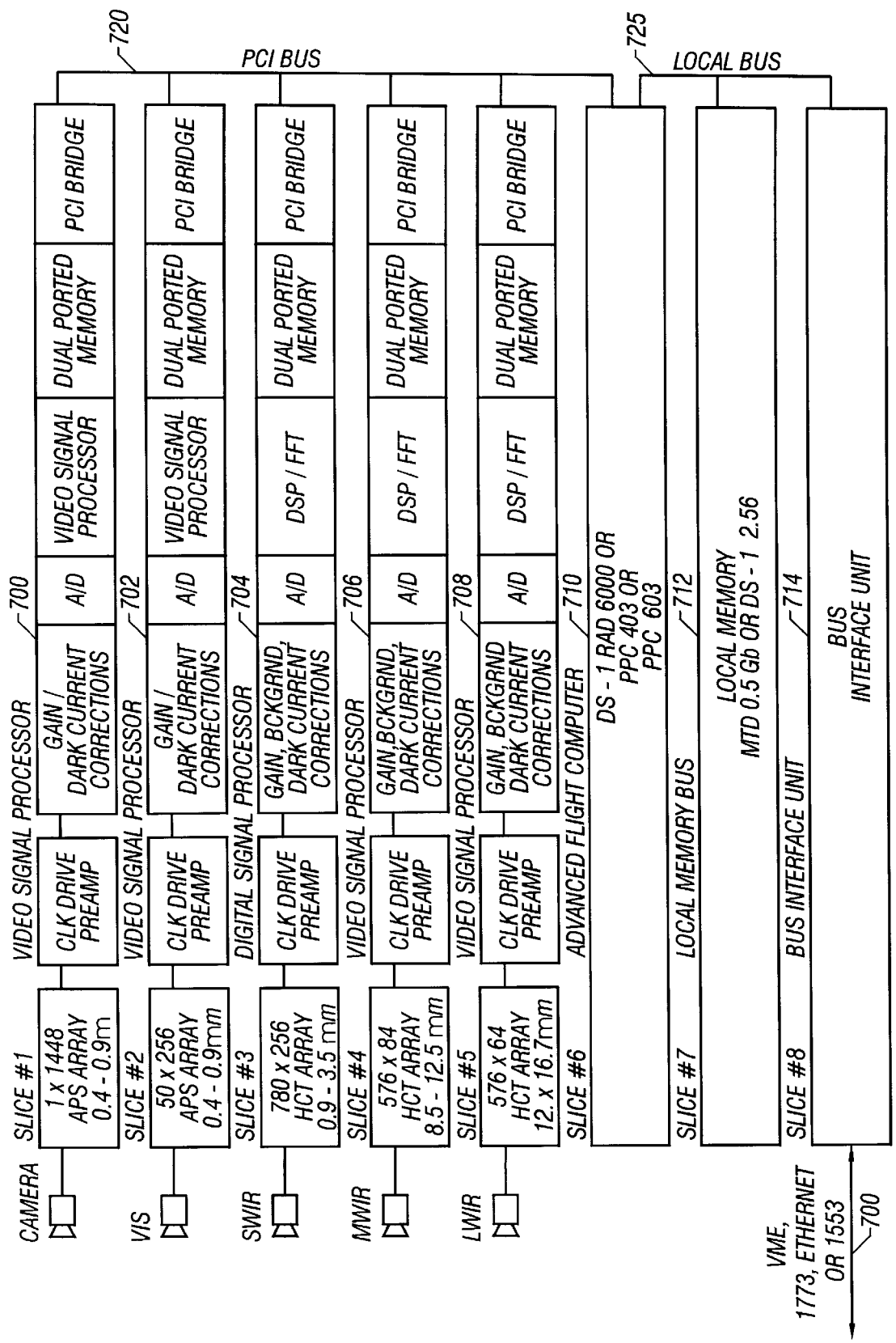
FIG. 7 shows an exemplary stack of devices and how they would be used.

An exemplary avionics stack is shown in FIG. 7. In this system, there are eight multi-chip modules or "slices": the video signal processor 700 and 702, the digital signal processor 704, video signal processor 706 and 708, flight computer 710, local memory 712, and bus interface unit 714. Note that a number of the devices together form the PCI bus 720, and others of the devices are only on a local bus 725. The bus interface unit connects to a VME or Ethernet bus 730.

Although only a few embodiments have been disclosed in detail above, those having ordinary skill in the art will understand that many modifications are possible in this embodiment without departing from the teachings given herein. For example, while the preferred embodiment describes multi-chip modules or slices being used, it should be understood that any similar technology including any circuit board or integrated circuit with connectors for metal connections could be similarly interconnected. The maximum usability is obtained when the connector extends around an entire perimeter or substantially an entire perimeter of the device. However, connectors on two edges or on only one edge would similarly be usable. All such modifications are intended to be encompassed within the following claims, in which:

What is claimed is:

1. A three-dimensional interconnect device, comprising:
   a first electronic device, having electrical connection parts at edge portions thereof, said electrical connection parts existing at least at two edge portions thereof;
   a first interface assembly, electrically and mechanically coupled to said electrical connection parts, including edge portions coupled to said electrical connection parts and inner surfaces defining a space portion allowing room for a part on said first electronic device which extends above said first electronic device, each of said edge portions having a plurality of connectors;
   a second electronic device, having electrical connection parts also coupled to said edge portions of said first interface assembly;
   a second interface portion connected to said electrical connection parts of said second electronic device;
   a first bus formed vertically on one of said plurality of connectors;
   a second bus formed vertically on another one of said plurality of connectors;
   a pressing portion; and
   holding portions, holding outside edges of all of said first and second electronic devices, said first and second interface assemblies and said pressing portion relative to one another and aligned with one another and pressing said pressing portion against said electronic devices and said interface assemblies.

2. A three-dimensional connection system, comprising:
   a first electrical device with a substantially rectangular outer perimeter, having electrical connection portions at least at each of four outer perimeter portions of said rectangular device, said electrical connection portion including a connection portion at least at various portions of said perimeter, and having alignment devices that are used for aligning said first electrical device;
   a second electrical device with a substantially rectangular outer perimeter, having electrical connection portions at least at each of four outer perimeter portions of said rectangular device, said electrical connection portion including a connection portion at least at various portions of said perimeter, and having alignment devices that are used for aligning said second electrical device;
   a spacer connector portion, formed of a perimeter portion with an open center, said perimeter portion including a rigid support portion and a connector portion, said connector portion having connectors which connect between the connection portion on said first electrical device and the connection portion on said second electrical device, said spacer connector portion also including alignment structures which in operation are aligned with said alignment devices in said first and second electrical devices;
   a first bus formed vertically on one of said connectors on said connector portion to extend between said first electrical device and said second electrical device;
   a second bus formed vertically on another one of said connectors on said connector portion to extend between said first electrical device and said second electrical device; and
   alignment and support elements, holding alignment between said electrical devices and said connector portion and then relative to one another to thereby form a package.

3. A system as in claim 2 wherein said connector portion comprises elastomeric connectors.

4. A system as in claim 3 further comprising a battery pack, integrated with a stiffener portion used for said support portion of the perimeter portion.

5. A three-dimensional interconnect device, comprising:
   a first electronic device, having electrical connection parts at edge portions thereof, said electrical connection parts thereon;
   a first interface assembly, electrically and mechanically coupled to said electrical connection parts, including edge portions formed of an elastomeric connector, coupled to said electrical connection parts, and inner surfaces defining a space portion allowing room for a part on said first electronic device which extends above said first electronic device, each of said edge portions having a plurality of connectors;
   a second electronic device, having electrical connection parts also coupled to said first interface assembly;
   a first bus formed vertically on one of said plurality of connectors;
   a second bus formed vertically on another one of said plurality of connectors;
   a pressing portion; and
   holding portions, holding corresponding portions of all of said first and second electronic devices, and said first interface assembly and said pressing portion relative to one another and aligned with one another and pressing said pressing portion against said electronic devices and said interface assemblies.

\* \* \* \* \*